(12) United States Patent
Ketonen

(10) Patent No.: US 6,400,236 B1
(45) Date of Patent: Jun. 4, 2002

(54) METHOD AND APPARATUS FOR A RADIO FREQUENCY POWER DIVIDER HAVING UN-TERMINATED OUTPUTS

(75) Inventor: Veli-Pekka Ketonen, Irving, TX (US)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/453,651

(22) Filed: Dec. 3, 1999

(51) Int. Cl.[7] .............................. H01P 3/08; H01P 1/22; G05F 3/16
(52) U.S. Cl. ..................... 333/127; 333/81 A; 323/224
(58) Field of Search ............... 333/127, 81 R, 333/81 A; 323/224

(56) References Cited

U.S. PATENT DOCUMENTS

| | | | |
|---|---|---|---|
| 3,346,805 A | 10/1967 | Hekimian | ............... 323/74 |
| 3,550,041 A | 12/1970 | Sauter | ............... 333/7 |
| 5,862,464 A | * 1/1999 | Omagari | ............... 455/280 |
| 6,225,873 B1 | * 5/2001 | Hill | ............... 332/102 |

FOREIGN PATENT DOCUMENTS

| | | |
|---|---|---|
| DE | 1 261 910 | 2/1968 |
| WO | WO 93/17531 | 9/1993 |

* cited by examiner

Primary Examiner—Robert Pascal
Assistant Examiner—Kimberly E Glenn
(74) Attorney, Agent, or Firm—T. Brooke Hayes

(57) ABSTRACT

A circuit for an output divider has an input port, an output port coupled to the input port at a first node, and a voltage controlled element, such as a varactor, having a first end coupled at the first node to the input port. A second end is coupled to a resistive element, such as a resistor, with the resistive element being coupled to a signal ground. The first end of the voltage controlled element is adapted to be coupled to a reference voltage of a load, the voltage controlled element having a high impedance when the reference voltage is present and having a low impedance when the reference voltage is not present. The impedance seen from the input port is substantially the impedance of the load when the reference voltage is present, and the impedance seen from the input port is substantially the impedance of the resistive element when the reference voltage is not present.

11 Claims, 9 Drawing Sheets

METHOD AND APPARATUS FOR A RADIO FREQUENCY POWER DIVIDER HAVING UN-TERMINATED OUTPUTS

BACKGROUND OF THE INVENTION

1. Field of the Invention

This invention relates in general to radio frequency power divider circuits, and more particularly, this invention relates to a method an apparatus for a radio frequency power divider used in a cellular base station.

2. Background

Power divider circuits, also known as power dividers or dividers or multi-couplers, are used in radio frequency applications to split an input signal over two or more outputs so that the input signal can be processed in parallel in subsequent stages. The power level of the output signals of a power divider can be equal of weighted. For instance, a 3 decibel (dB) power divider with two outputs provides each output signal with a power level of 3 dB below the power level of the input signal.

FIG. 1A shows a basic passive configuration of a power divider arrangement using three power dividers 20, 22, 24 to provide four output signals. While the circuit is generally inexpensive, unterminated outputs (i.e., when one or more inputs is not under a load, for example 50 ohms) can cause problems such as poor input matching (resulting in power loss), large ripple in the pass-band of the circuit, and increased insertion signal loss introduced by the circuit in the terminated outputs. Further, because power dividers are relatively narrow band devices, the arrangement of FIG. 1 may result in poor isolation between the outputs, or poor out of band isolation between the outputs.

FIG. 1B shows a passive arrangement wherein attenuators 26A–26D are used at each of the four output lines of FIG. 1A. While this arrangement is also inexpensive and reduces the insertion loss when unterminated loads are present, the attenuators introduce a high amount of insertion loss into the system.

FIG. 1C shows a passive arrangement wherein isolators 28A–28D are used at each of the four output line of FIG. 1A. While this arrangement reduces insertion loss and pass band ripple, and provides effective isolation between the outputs when unterminated lines are used, this arrangement can be expensive due to the cost of the isolators.

FIG. 1D shows an active arrangement wherein active amplifiers 30A–30D and attenuators 32A–32D are used in series at each of the four output line of FIG. 1A. While this arrangement reduces insertion loss and pass band ripple when unterminated lines are used, this arrangement can be expensive due to the cost of the amplifiers, and can introduce a high noise figure which provides nonlinearity into the system. Further, a external DC power supply is needed for the amplifiers.

Another approach is to use filters at each of the output lines, which would help with out of band isolation, but would not reduce passband ripple or insertion loss.

It is with these shortcomings of the existing art in mind that the present invention was developed. What is needed is a circuit arrangement, or method, for a power divider which improves performance of the divider by improving out of band isolation, insertion loss, and passband ripple when the power divider is operating with terminated outputs or with unterminated outputs.

SUMMARY OF THE INVENTION

In light of the above, therefore, according to a broad aspect of the invention, an apparatus for an output divider which provides a default load to an output line of the power divider, when the power divider is operating with unterminated outputs. The apparatus has an input port, an output port coupled to the input port at a first node, and a voltage controlled element, such as a varactor, having a first end coupled at the first node to the input port. A second end is coupled to a resistive element, such as a resistor, with the resistive element being coupled to a signal ground. The first end of the voltage controlled element is adapted to be coupled to a reference voltage of a load, the voltage controlled element having a high impedance when the reference voltage is present and having a low impedance when the reference voltage is not present. The impedance seen from the input port is substantially the impedance of the load when the reference voltage is present, and the impedance seen from the input port is substantially the impedance of the resistive element when the reference voltage is not present. In this manner, the apparatus, when coupled to an output line of a power divider, provides a default load, as seen from the output line of the power divider, when the output line of the power divider is unterminated. When the output line of the power divider is terminated with a load, the impedance as seen from the output line of the power divider is substantially the impedance of the load. In one implementation, even when one or more output lines of a power divider are unterminated, the apparatus of the present invention is adapted to provide a default load to each output line of the power divider, thereby improving performance when compared with conventional power dividers having unterminated output lines.

The foregoing and other features, utilities and advantages of the invention will be apparent from the following more particular description of a preferred embodiment of the invention as illustrated in the accompanying drawings.

DETAILED DESCRIPTION OF THE PREFERRED EMBODIMENT

In accordance with the present invention, disclosed herein is an apparatus, method, and system which can be used to improve the performance of a power divider, particularly when one or more of the output lines of the power divider are unterminated. In a first mode, when there is no load attached to the output of the apparatus, the apparatus provides a default load, for example an impedance of 50 ohms, so that the output of the power divider is not unterminated. By providing the default load on an output line of the power divider, the overall performance of the power divider is improved, such as the amount of ripple occurring in the pass band of the power divider is reduced, the insertion loss is reduced, and the overall isolation between input and output is improved, when compared with partially unterminated power divider outputs.

In a second mode, where the output line of the power divider is terminated with a load, the present invention de-selects the default load, and can also provide a filtering stage, such as a unity gain pass filter tuned to have a suitable pass band. In one example, the dc voltage provided by the center conductor of the RF cable coupled to the load, is fed into a voltage controlled band pass filter which becomes active upon the detection of the dc voltage. When the dc voltage is removed, the voltage controlled filter is effectively removed from the circuit and the default load is then provided as described above.

Embodiments of the present invention, therefore provide the two distinct modes of operation, wherein when the power divider has an unterminated output, a default load is provided by the present invention; and in the second mode when the power divider is provided with a load, the default load is removed from the system so that the load seen by the power divider output line is dictated by the impedance of the load coupled thereto.

Figure 1A:
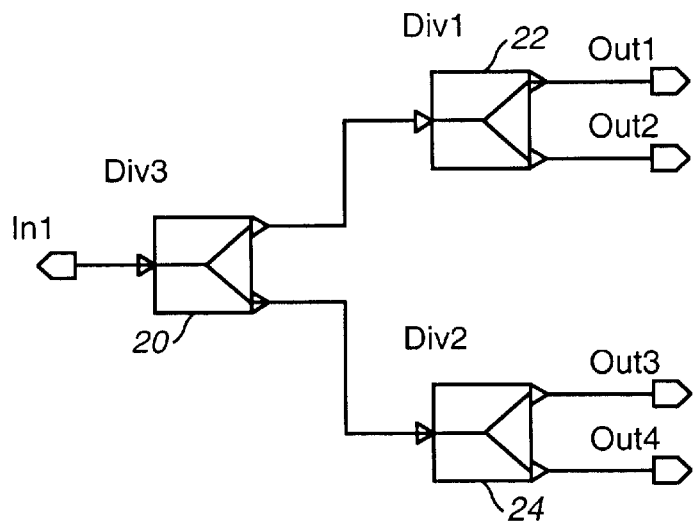
FIG. 1A illustrates a block diagram of a power divider arrangement splitting a single input signal into four output signals.
Figure 1B:
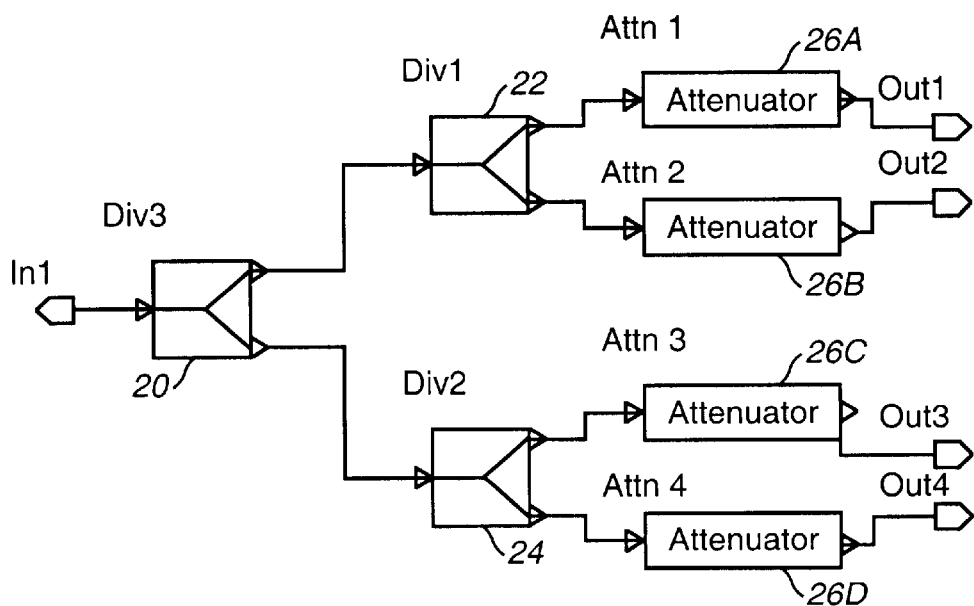
FIG. 1B illustrates a block diagram of a power divider arrangement splitting a single input signal into four output signals with attenuators placed in series with each output signal.
Figure 1C:
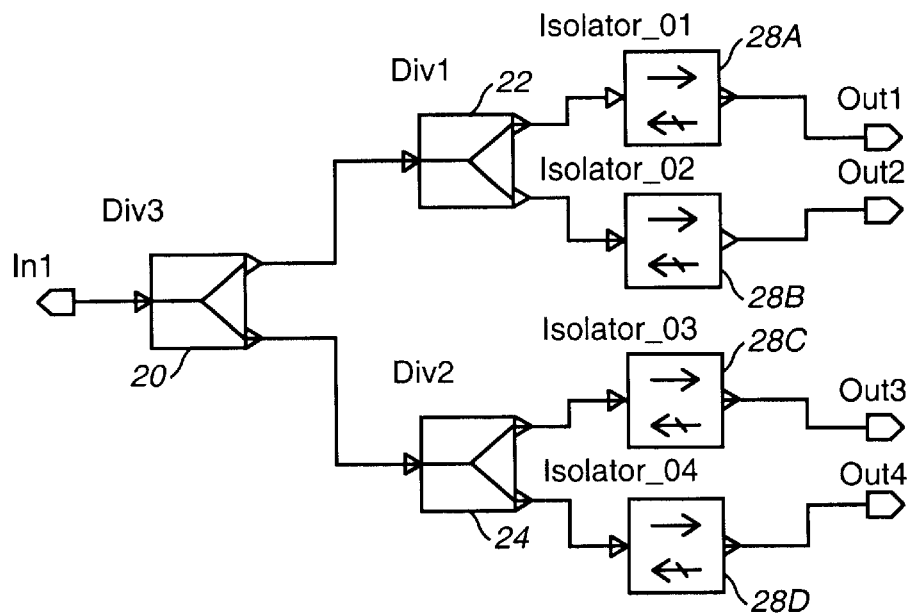
FIG. 1C illustrates a block diagram of a power divider arrangement splitting a single input signal into four output signals with isolators placed in series with each output signal.
Figure 1D:
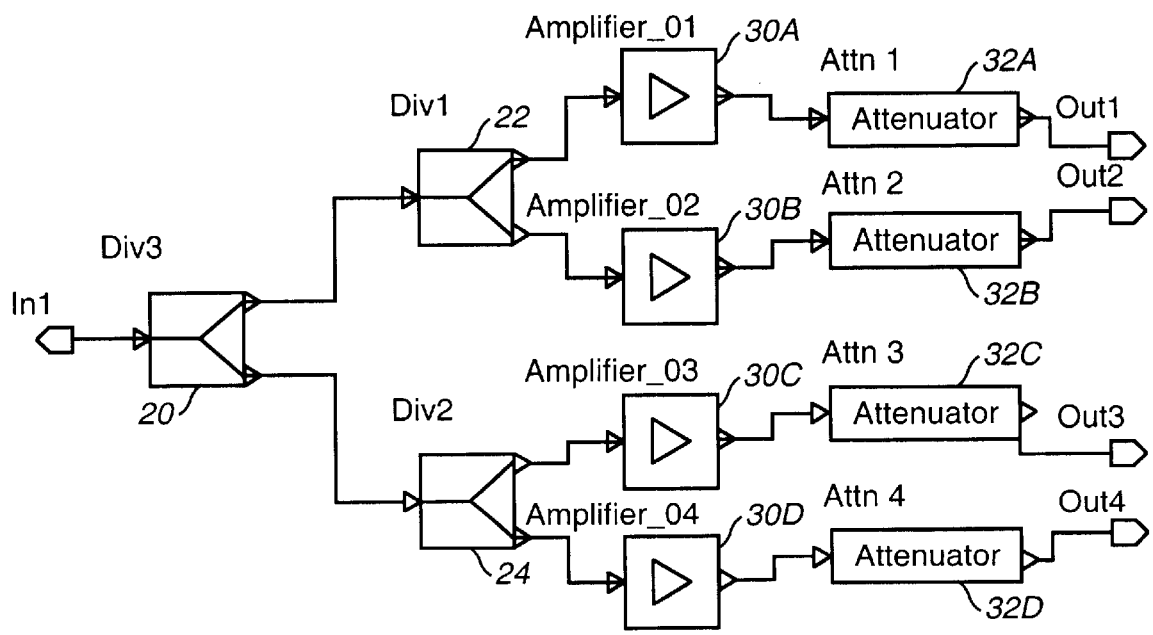
FIG. 1D illustrates a block diagram of a power divider arrangement splitting a single input signal into four output signals with active amplifiers and attenuators placed in series with each output signal.
Figure 2:
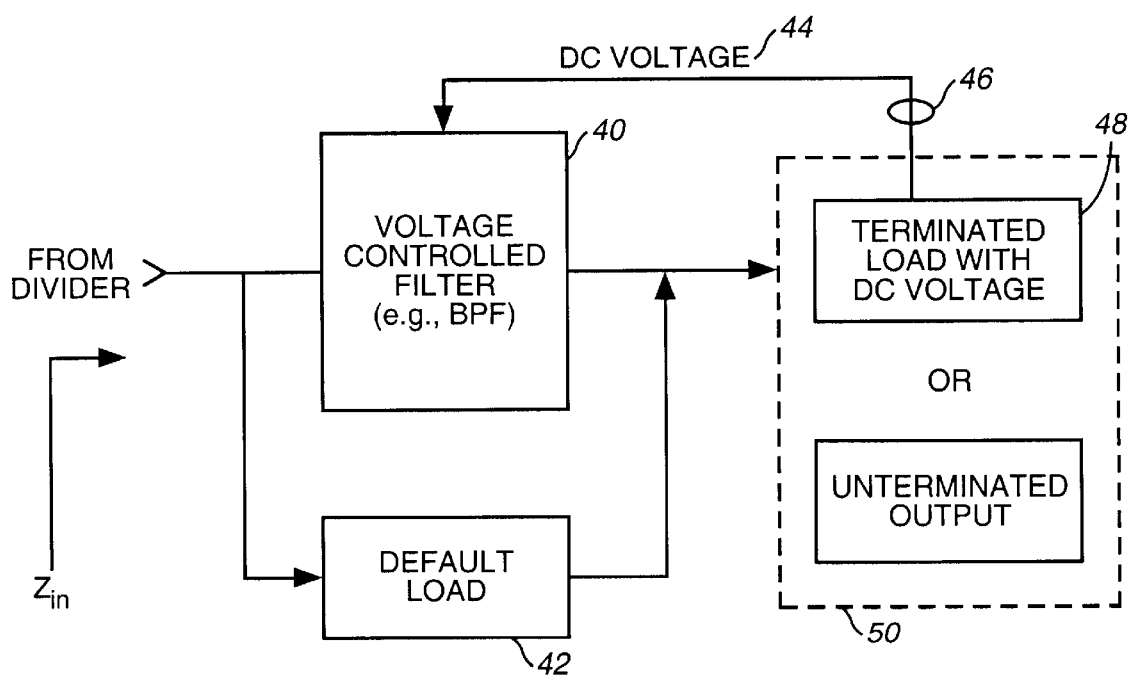
FIG. 2 illustrates a block diagram of one embodiment of the present invention.

Referring now to FIG. 2, one embodiment of the present invention is shown having a voltage controlled filter 40 and a default load 42. The voltage controlled filter 40 can be, for example, a unity gain band pass filter or all pass filter, or, if desired, a notch filter or other filter having various frequency responses. The frequency response used for the voltage controlled filter is dependent upon the particular application in which the present invention is used.

Importantly, the filter 40 is responsive to the dc voltage 44 provided from the center conductor of the RF cable 46 coupled to the load 48. When a load 48 is present, the dc voltage from the center conductor activates the voltage controlled filter 40 so that the filter, with its corresponding frequency characteristics, is enabled as a part of the signal processing path along which the signal passes. When there is no dc voltage 44 present to activate the voltage controlled filter 40, (i.e. when the output is unterminated, shown as 50), then the default load 42 becomes part of the flow path along which the signal is processed.

Accordingly, as shown in FIG. 2, the input impedance seen by the output line of a power divider will be either the default load 42, or the impedance of the load 48 coupled to the output terminal.

In one example, the default load 42 has an impedance of 50 ohms. The amount of the impedance selected for the default load will depend upon the particular system in which the present invention is employed. For example, in some transmission line systems, it may be desirable for the default load to have an impedance, for example, of 75 ohms. The amount of the impedance of the default load 42 should be selected so as to minimize the signal reflections or other negative effects associated with load mismatches or unterminated outputs.

Figure 3A:
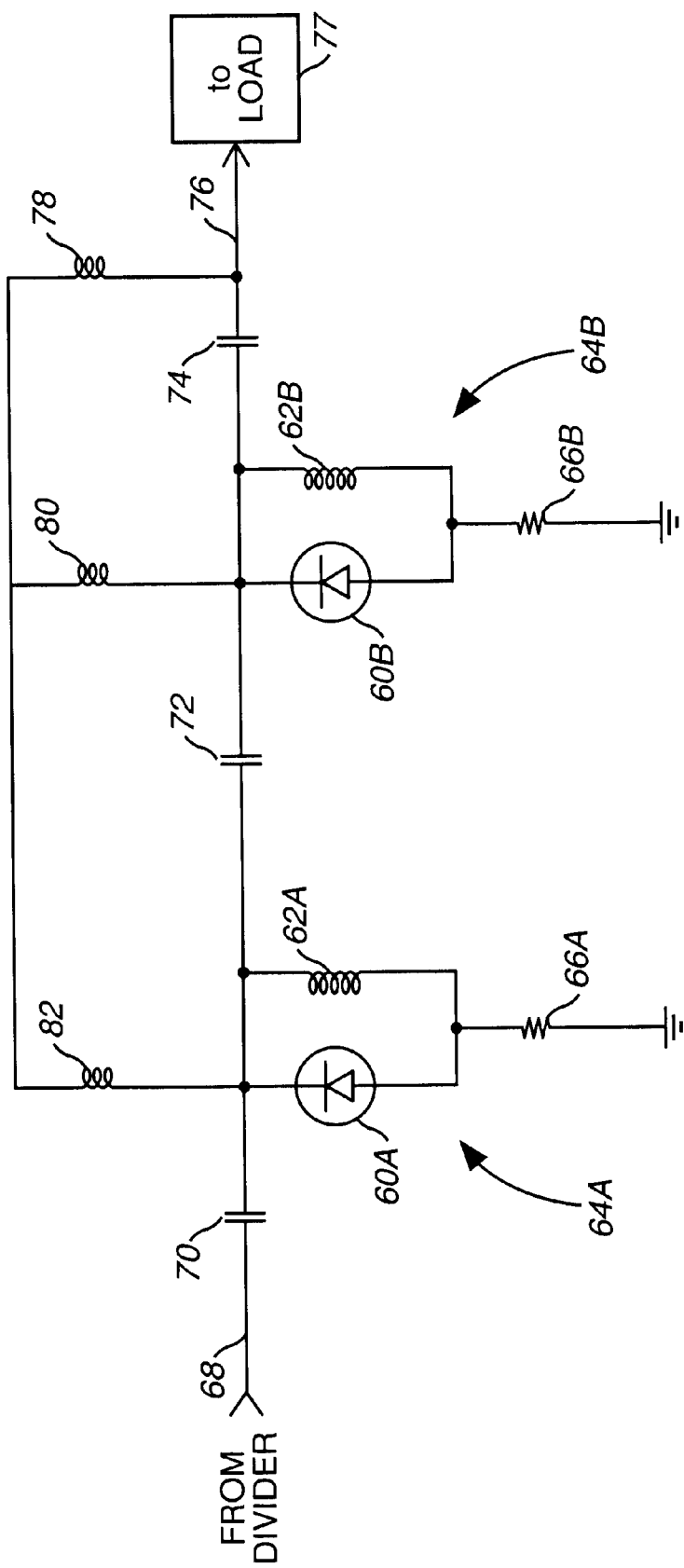
FIGS. 3A–3C illustrate an exemplary circuit diagram of a portion of one embodiment of the present invention.

Referring now to FIG. 3A, one example of the present invention is illustrated in the circuit shown. The circuit is provided with two stages wherein in each stage a varactor 60A, 60B (variable capacitor) is coupled in parallel with an inductor 62A, 62B to form a parallel resonator 64A, 64B. The parallel resonator 64A, 64B is coupled between the signal path and ground with a resistor 66A, 66B. The input 68 to the circuit of FIG. 3A is coupled through a bypass capacitor 70 to the output line of the power divider (not shown).

The first stage of the circuit, having the parallel resonator 64A with the resistor 66A coupled to ground, is coupled by a filtering capacitor 72 to the second stage having another parallel resonator 64B connected to a resistor 66B coupled to ground. The second parallel resonator is coupled through a filtering capacitor 74 to the output 76. The output 76 is adapted to be coupled to the load 77 through an RF cable. Three inductors 78, 80, 82 are provided to couple the dc voltage from the center conductor of the RF cable to the varactors 60A, 60B in order to provide a tuning voltage to the varactors which activate the voltage controlled filtering function of the circuit when a load 77 is present at the output 76.

In one example, the inductors 78, 80, 82 are large inductors and operate as "chokes" wherein the inductors block the passage of RF signals but allow dc signals (such as dc voltages or currents) to pass through the inductor. The capacitors 70, 72, 74 operate to block dc signals (i.e. voltages and currents) but allow RF signals to pass. Hence, the capacitors provide dc isolation between the signal ports 68, 76, and can also be used as filtering parameters to alter the frequency response of the overall circuit.

As an example, the coupling capacitors 70, 74 on the input and output can be 65 pico farads, while the interstage capacitor 72 is 10 pico farads. The resistors 66A, 66B can be 100 ohms each, while the blocking inductors 78, 80, 82 are 1,000 nano farads each. The inductors 62A, 62B in parallel with the varactors 60A, 60B are, for example, 12 nano farads each.

In operation, FIG. 3A provides two modes of operation. In a first mode, when no load 77 is connected to the output 76, no dc voltage is provided through inductors 78, 80, 82. Accordingly, since there is no dc voltage fed into the varactor 60A, 60B, the capacitance of the varactor increases substantially, such that the varactor 60A, 60B effectively becomes a short circuit. Accordingly, the input impedance of the circuit of FIG. 3A is substantially dictated by the parallel combination of the resistors 66A, 66B. If the resistors are 100 ohm resistors, then the input impedance would be 50 ohms.

In the second mode or operation, where the output 76 is coupled to a load 77 providing a dcc voltage, the dc voltage is sensed by the inductors 78, 80, 82 and passed by the inductors to provide the voltage (i.e. a tuning voltage) to the varactors 60A, 60B. In this sense, it can be said, that the inductors 78, 80, 82 deliver the bias voltage from the load 77 to the varactors. Upon receiving the dc voltage, the capacitance of the varactors lowers such that the varactors 60A, 60B stop acting as a short circuit and become tuned with the inductor 62A, 62B in parallel. When the varactors 60A, 60B reach a steady state capacitance value, the parallel, resonators 64A, 64B formed by the varactor in parallel with the inductor lets RF signals pass if those signals are within the range of the resonant frequency of the parallel resonator 64A, 64B. Conversely, the frequency components of the signals which are not within the range of the parallel resonator are effectively shunted to ground. In this manner, the parallel resonators 64A, 64B of FIG. 3A provide a band pass filtering function if the varactor and inductor are tuned to resonate about a center frequency. Parallel resonators have high impedance level at resonance frequency, and elsewhere the impedance level gets smaller with rate that depends on resonator Q-value.

Figure 3B:
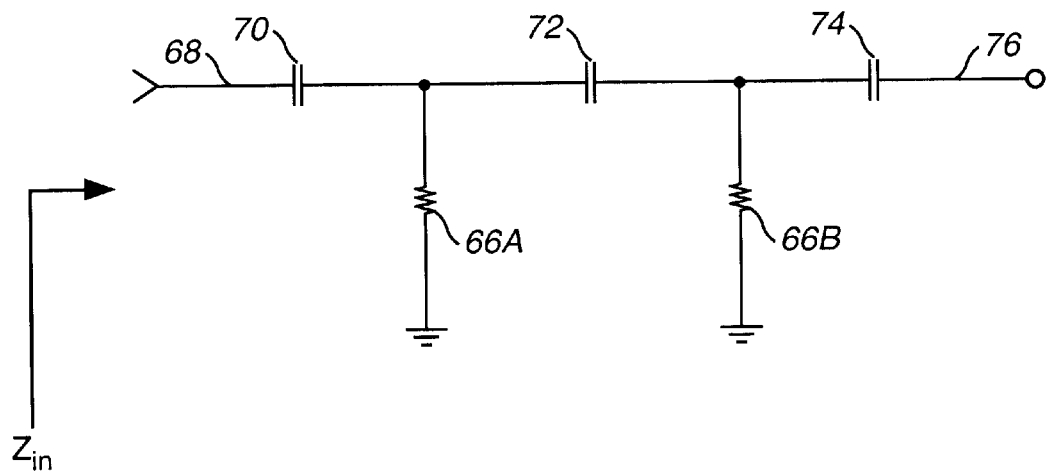
Figure 3C:
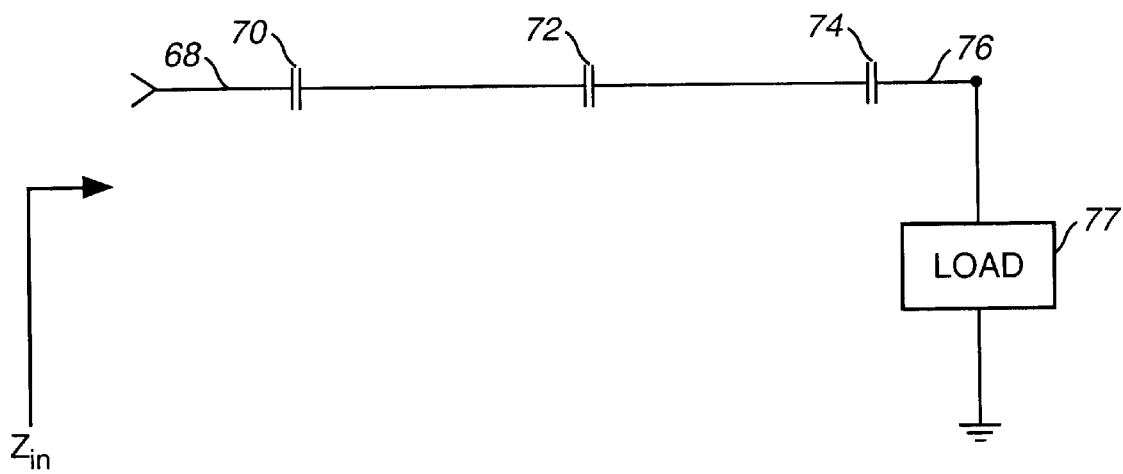

The operation of the circuit of FIG. 3A can be seen in FIGS. 3B and 3C. Referring to FIG. 3B, when the output 76 of the circuit is not terminated with a load having a dc voltage, the equivalent circuit is shown in FIG. 3B. The input impedance can be modeled as effectively as the two resistors 66A, 66B in parallel. For example, if the first resistor 66A is 100 ohms and the second resistor 66B is 100 ohms, the impedance seen at the input 68 of the circuit is approximately 50 ohms. The capacitors 70, 72, 74 can be selected so that at the resonant frequency of the circuit, the capacitors effectively can be modeled as short circuits which do not effect the RF signal passed therethrough.

Referring to FIG. 3C, when the output 76 is terminated with a load 77 having a dc voltage through the center conductor, the equivalent circuit is shown. The input impedance is dictated by the impedance of the load 77 coupled to the output 76. Again, the capacitors 70, 72, 74 can be selected so that at the desired frequencies, the capacitors act as short circuits and do not measurably affect the signal passed therealong.

One benefit of the present invention is that the present invention does not require a separate dc current or voltage coupled to the circuit. Rather, the dc voltage of the center conductor of the RF cable coupled to the load 77 is used to provide the tuning voltage to the varactors. As explained above, RF cables and power dividers typically have a dc voltage in the center conductor. In particular, the loads to which power dividers are coupled can be, for example, active units such as a channel unit. Embodiments of the present invention tap the dc voltage of the center conductor provided by the load, back to the varactors, so as to provide a tuning voltage for the varactors. In one example, it has been found that the present invention consumes less than 1 mill-amp of current to tune the varactors.

The inductor which is placed in parallel with the varactor can be a discrete inductor, a microstrip inductor, or a strip line inductor, or the like, such as ceramic resonators, ferrites, etc. The varactors, being variable capacitors, can also be implemented using a current controllable capacitive element, if desired.

Figure 3D:
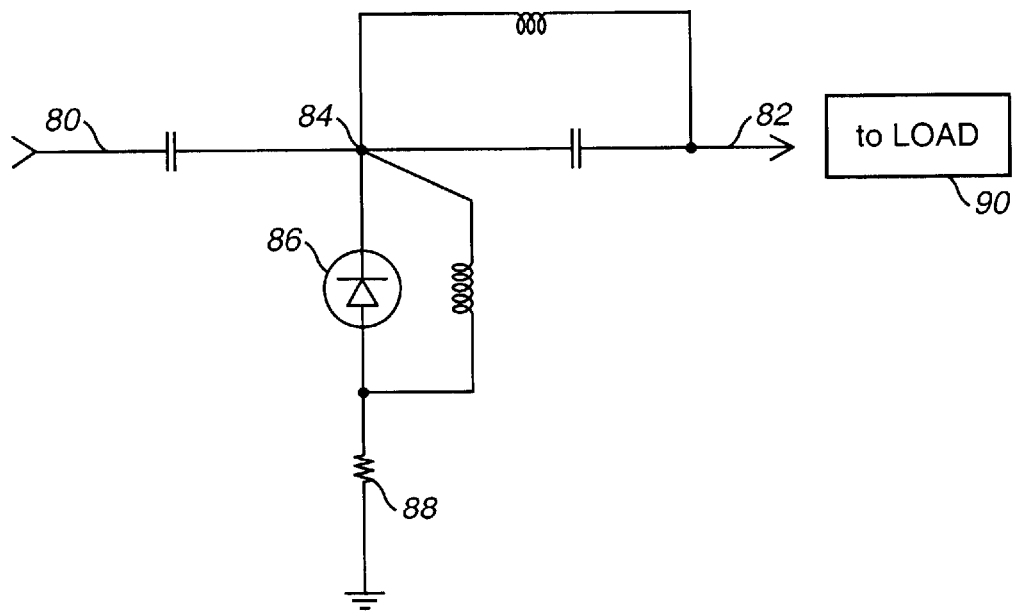
FIG. 3D illustrates a simplified version of the circuit of FIG. 3A wherein a single stage implementation is shown, in accordance with one embodiment of the present invention.

FIG. 3D illustrates a simplified version of the circuit of FIG. 3A wherein a single stage implementation is shown. The circuit comprises an input port 80, an output port 82 coupled to the input port 80 at a first node 84, and a voltage controlled element 86, such as a varactor, having a first end coupled at the first node 84 to the input port. A second end is coupled to a resistive element 88, such as a resistor, with the resistive element 88 being coupled to a signal ground. The first end of the voltage controlled element is adapted to be coupled to a reference voltage of a load 90, the voltage controlled element 86 having a high impedance when the reference voltage is present and having a low impedance when the reference voltage is not present. The impedance seen from the input port 80 is substantially the impedance of the load 90 when the reference voltage is present, and the impedance seen from the input port 80 is substantially the impedance of the resistive element 88 when the reference voltage is not present. In the example of FIG. 3D, if the resistor 88 is 50 ohms, then the input impedence seen when the output 82 is unterminated (i.e., no dc voltage is provided to the voltage controlled element 86) is substantially 50 ohms.

Figure 4:
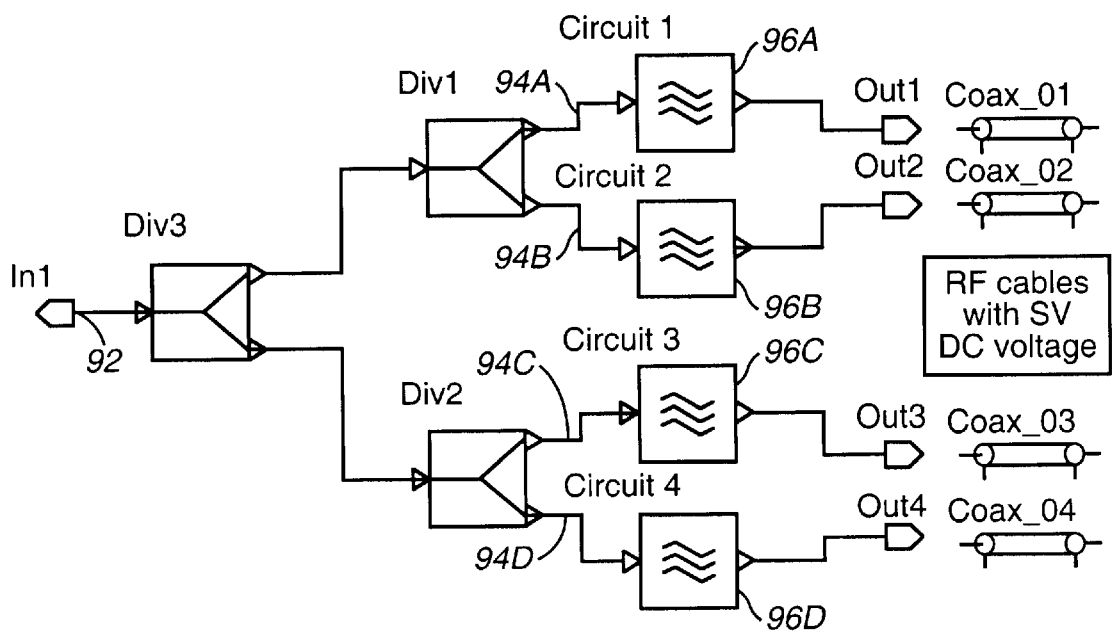
FIG. 4 illustrates a block diagram of a power divider arrangement splitting a single input signal into four output signals with one embodiment of the present invention placed in series with each output signal.

FIG. 4 illustrates an example of a power divider arrangement splitting a single input signal 92 into four output signals 94A, 94B, 94C, 94D with embodiments 96A, 96B, 96C, 96D of the present invention placed in series with each output signal. In this manner, each output line 94A–94D of the power divider arrangement will see a load of either an impedance of the actual load, or the default impedance provided by the present invention when the output line is unterminated.

Figure 5:
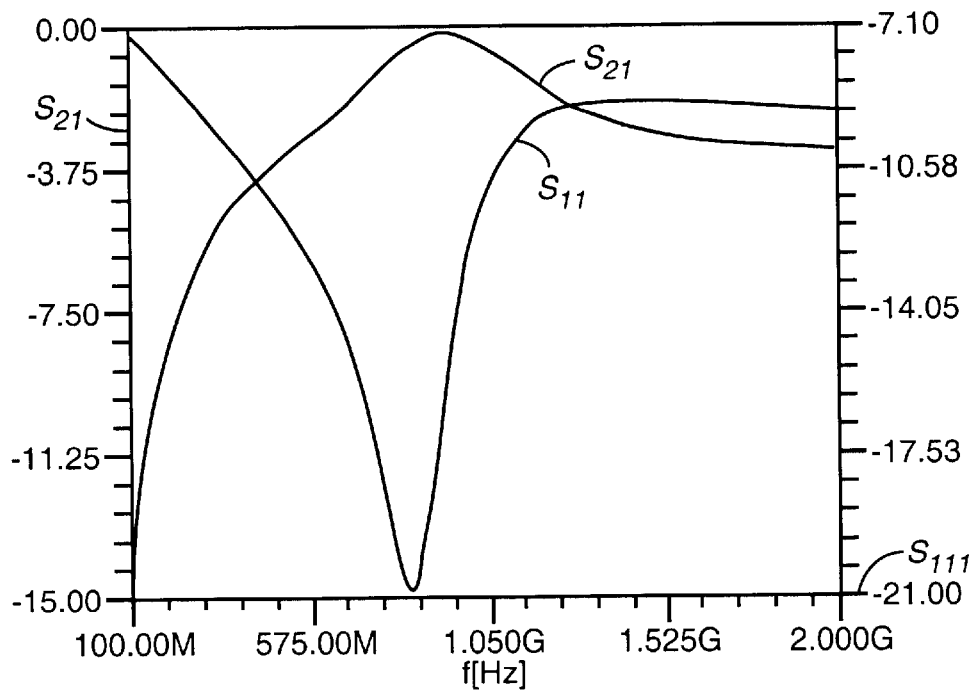
FIG. 5 illustrates a graphical illustration of the frequency response of the circuit of FIG. 3A, when the varactors have a capacitance of approximately 2.2 pF.
Figure 6:
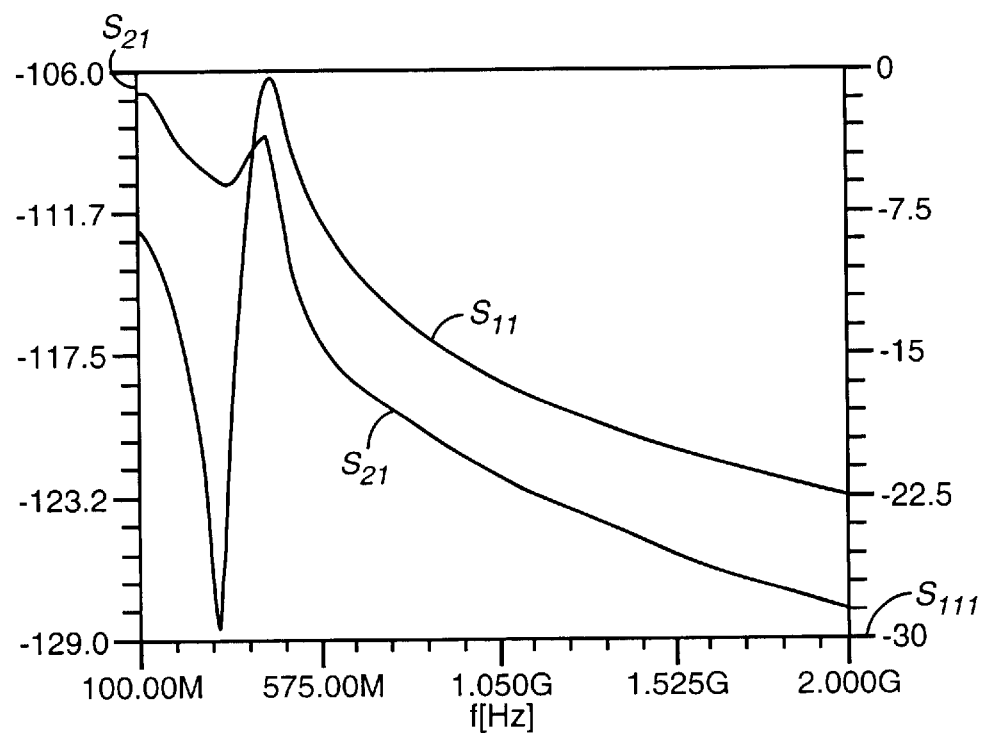
FIG. 6 illustrates a graphical illustration of the frequency response of the circuit of FIG. 3A, when the varactors have a capacitance of approximately 10 pF.

FIGS. 5 and 6 illustrate example data as to how the present invention operates over various frequencies. This data was obtained using a convention circuit modeling tool to obtain the response of a circuit as shown in FIG. 3A. In FIG. 5, simulation results from the circuit of FIG. 3A are shown when the varactors have 2.2 pF capacitance (high tuning voltage means always lower capacitance). The left scale shows a curve S21 (curve starting from about −15 dB at 100 MHz) and a curve S11 (curve starting at about 0 dB at 100 MHz). S21 has a passband around 950 MHz, where S11 is also good.

In FIG. 6, simulation results from the circuit of FIG. 3A are shown when the varactors have 10 pF capacitance (low tuning voltage means always higher capacitance). The left scale shows a curve S21 (curve starting from about −26 dB at 100 MHz) and a curve S11 (curve starting at about −30 dB at 100 MHz). S11 shows now a good return loss (about −15 dB) at band of operation around 950 MHz, meaning that divider outputs see a good return loss and the dividers work well without decreased insertion loss and pass band ripple. S21 shows here some value (about −120 dB) because output was opened with 10 mF inductor in output (see FIG. 4).

Figure 7:
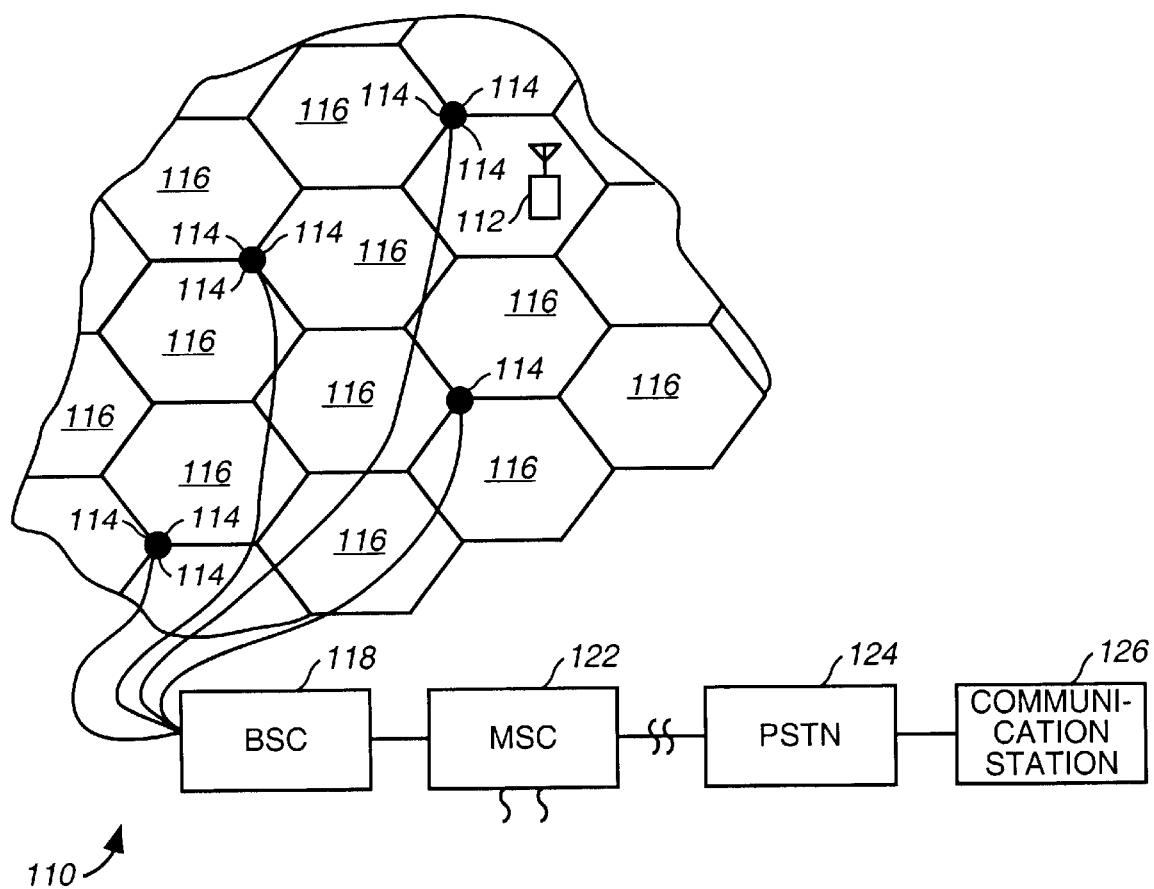
FIG. 7 illustrates a functional representation of a cellular communication system and the positioning of a radio base station of the system wherein an embodiment of the present invention is operable.

Embodiments of the present invention can be used in cellular communications systems. Referring to FIG. 7, a portion of a cellular communication system, as shown generally at 110, permits two-way radio communications with mobile stations, of which the mobile station 112 is exemplary, when a mobile station is positioned within a geographical area encompassed by the system. The network infrastructure of the cellular communication system includes a plurality of spaced-apart radio base stations 114. The base stations 114 are positioned at selected locations throughout the geographical area to be encompassed by the communication system.

In the implementation shown in FIG. 7, sets of three radio base stations 114 are grouped together at common locations to define sector cells, in conventional manner.

Groups of the radio base stations 114 are coupled to a BSC (base station controller) 118. A BSC is operable to control operation of the radio base stations coupled thereto.

And, groups of BSCs 118 are coupled in turn to an MSC (mobile switching center) 122. An MSC performs switching operations and is coupled to a PSTN (public-switched telephonic network) 124. The PSTN is coupled to communication stations, such as the communication station 126, here a conventional, wire-line terminal.

Telephonic communication is effectuated between, for instance, the mobile station 112 and the communication station 126 by way of the PSTN 124, the network infrastructure including the MSC 122, BSC 118, and a radio base station 114 to which the mobile station 112 is proximate by way of a radio link formed between the mobile station and the radio base station. To better effectuate the communication of radio signals upon the radio channels formed between the mobile station and the radio base station, antenna transducer elements, referred to as mast heads, are positioned, many times to be elevated above other portions of the radio base station 114.

Typically, the mast head is coupled to other circuitry of the radio base station by way of a cable. However, cable loss is associated with the cable, and a signal conducted through the cable exhibits a loss corresponding to the cable loss. Operation of an embodiment of the present invention provides a manner by which the signal conducted through the cable is not further degraded by unterminated outputs of a power divider used in the radio base station.

Figure 8:
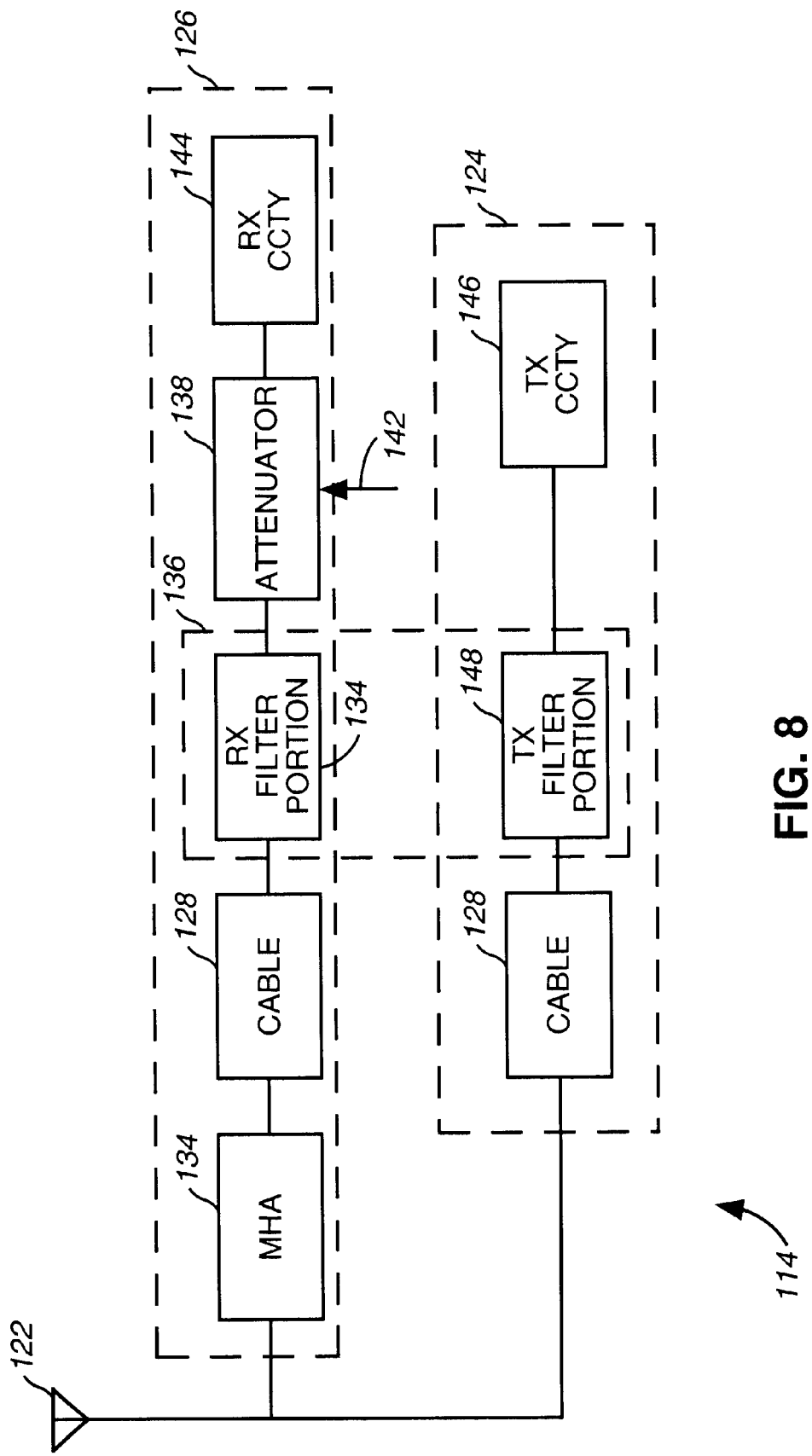
FIG. 8 illustrates a functional block diagram of a radio base station which includes an embodiment of the present invention as a portion thereof.

FIG. 8 illustrates a radio base station 114, exemplary of a base station which forms a portion of the network infrastructure of the cellular communication system 110 shown in FIG. 7. The radio base station 114 includes one or more embodiments of the present invention as a portion thereof. The base station includes a mast head 122 operable to transduce reverse link signals received thereafter into electrical form and also to transduce forward link signals for transmission therefrom into electromagnetic form.

The radio base station includes both a transmitter portion 124 and a receiver portion 126 to permit transceiving of both forward-link and reverse-link signals respectively. To facilitate communications, the mast head 122 is typically positioned at an elevated location, often separated from other portions of the radio base station. The mast head 122 is oftentimes, therefore, coupled to the transmitter and receiver portions 124 and 126 of the base station by way of a cable 128.

The base station 114 includes a mast head amplifier (MHA) 134 positioned proximate to the mast head 122, in-line between the mast head and the cable 128 extending to the receiver portion 126. When a received signal is provided to the receiver portion 126 of the radio base station 114, the signal is of an amplified signal level as provided by the mast head amplifier 134. As illustrated, in one example, the cable 128 is coupled to the receive filter portion 134 of a filter duplexer 136. The receive filter portion 134 exhibits a filter pass band of a selected bandwidth for passing received signals within such pass band and for rejecting signals beyond such pass band. Received signals passed by the receive filter portion 134 are applied to an attenuator 138. The attenuator attenuates the signals applied thereto with a selected level of attenuation. Control signals for controlling the levels of attenuation by which the attenuator attenuates the receive signals applied thereto are applied to the attenuator by way of the line 142. Levels of attenuation by which the attenuator 138 attenuates the receive signals are, in one example, dynamically determined.

Once attenuated by the attenuator 138, the receive signals are applied to other portions of the receiver portion 126 of the radio base station 114, here represented by the receiver circuitry 144. Conventional receiver circuitry functions are performed thereat, such as down-conversation and demodulation operations. Appropriate selection of the level of amplification by which the amplifier 134 amplifies the received signals applied thereto, and thereafter, appropriate selection of the levels of attenuation by which the attenuator 138 attenuates signals applied thereto ensures that signals which exhibit appropriate levels of linearity and noise figures are applied to the receiver circuitry 144.

The radio base station 114 is further shown to include transmitter circuitry 146 operable to generate transmit signals which are applied to a transmit filter portion 148 of the filter duplexer 136, thereafter to be conducted through the cable 128 and transduced by the mast head 122.

A power divider incorporating one or more embodiments of the present invention can be utilized within radio base station 114 as a portion of the receive section 126 or the transmit portion 124, depending on the particular implementation. Further, with reference to FIG. 7, a power divider incorporating one or more embodiments of the present invention can be utilized within the BSC 118, the MSC 122, the PSTN 124, or the communication station 126, depending on the particular implementation. Embodiments of the present invention could also be utilized in other applications wherever power dividers or multi-couplers are used The power dividers could be, for example, Wilkinson Power Dividers, 90° Hybrid Couplers or the like.

While the invention has been particularly shown and described with reference to a preferred embodiment thereof, it will be understood by those skilled in the art that various other changes in the form and details may be made without departing from the spirit and scope of the invention.

I claim:

1. A circuit, comprising:
   an input port;
   an output port coupled to said input port at a first node;
   a voltage controlled element having a first end coupled at the first node to said input port, and a second end coupled to a resistive element, said resistive element being coupled to a signal ground, said first end of said voltage controlled element adapted to be coupled to a reference voltage of a load, wherein said reference voltage is a DC voltage from a center conductor coupled to said load, said voltage controlled element having a high impedance when said reference voltage is present and having a low impedance when said reference voltage is not present.

2. The circuit of claim 1, wherein the impedance seen from the input port is substantially the impedance of the load when the reference voltage is present, and the impedance seen from the input port is substantially the impedance of the resistive element when the reference voltage is not present.

3. The circuit of claim 1, wherein said voltage controlled element is a varactor.

4. The circuit of claim 1, further comprising an inductor connected in parallel with said voltage controlled element to form a parallel resonator.

5. The circuit of claim 4, wherein said parallel resonator is tuned to a resonant frequency wherein said parallel resonator operates as a band pass filter.

6. A power divider, comprising:
   a power divider having an input line and at least two output lines, said power divider splitting an input signal on the input line into at least a first output signal and a second output signal, each output signal being provided on separate output lines;

a first circuit coupled to said first output line, the first circuit comprising:
an input port;
an output port coupled to said input port at a first node;
a voltage controlled element having a first end coupled at the first node to said input port, and a second end coupled to a resistive element, said resistive element being coupled to a signal ground, said first end of said voltage controlled element adapted to be coupled to a reference voltage of a load, said voltage controlled element having a high impedance when said reference voltage is present and having a low impedance when said reference voltage is not present; and a second circuit coupled to said second output line, the second circuit comprising:
an input port;
an output port coupled to said input port at a first node;
a voltage controlled element having a first end coupled at the first node to said input port, and a second end coupled to a resistive element, said resistive element being coupled to a signal ground, said first end of said voltage controlled element adapted to be coupled to a reference voltage of a load, said voltage controlled element having a high impedance when said reference voltage is present and having a low impedance when said reference voltage is not present.

7. The power divider of claim 6, wherein the impedance seen from the input port of said first circuit is substantially the impedance of the load when the reference voltage is present, and the impedance seen from the input port is substantially the impedance of the resistive element when the reference voltage is not present.

8. The power divider of claim 6, wherein said reference voltage of said first circuit is a DC voltage from a center conductor coupled to said load.

9. The power divider of claim 6, wherein said voltage controlled element of said first circuit is a varactor.

10. The power divider of claim 6, wherein the first circuit further comprises an inductor connected in parallel with said voltage controlled element to form a parallel resonator.

11. The power divider of claim 10, wherein said parallel resonator of the first circuit is tuned to a resonant frequency wherein said parallel resonator operates as a band pass filter.

* * * * *